United States Patent [19]

Emery

[11] 4,147,982

[45] Apr. 3, 1979

[54] TURBINE GENERATOR GROUND CURRENT ARCING DETECTION APPARATUS AND METHOD

[75] Inventor: Franklin T. Emery, Pittsburgh, Pa.

[73] Assignee: Electric Power Research Institute, Inc., Palo Alto, Calif.

[21] Appl. No.: 840,057

[22] Filed: Oct. 6, 1977

[51] Int. Cl.$^2$ .................... G01R 31/12; G01R 31/02
[52] U.S. Cl. ......................................... 324/54; 340/647
[58] Field of Search ................ 324/51, 54, 158 MG; 322/99; 318/490; 340/647, 648

[56] References Cited

U.S. PATENT DOCUMENTS

| | | | |
|---|---|---|---|
| 3,015,774 | 1/1962 | Eigen | 324/54 |
| 3,047,799 | 7/1962 | Peer et al. | 324/54 |
| 3,346,808 | 10/1967 | Bader | 324/54 |
| 3,364,420 | 1/1968 | Krueger | 324/54 |
| 3,869,665 | 3/1975 | Kenmochi et al. | 324/54 X |
| 3,904,940 | 9/1975 | Burrus | 324/54 X |

Primary Examiner—Gerard R. Strecker
Attorney, Agent, or Firm—Flehr, Hohbach, Test, Albritton & Herbert

[57] ABSTRACT

Changes in flux density in large rotating machinery induce a voltage in the rotating shaft of the machine. The shaft is isolated electrically from the machine frame so that currents do not flow from the shaft to the frame toward ground potential. Apparatus and method is provided for detecting arcing current between the shaft and support bearing surfaces which may occur upon failure of the insulation which isolates the shaft from the frame. The method involves monitoring the high frequency voltage components developed between the support bearings at opposing ends of the rotating shaft. The apparatus includes an electrical connection at each of the two shaft support bearings. The two connections are brought to the input of a high pass filter. The high frequencies passed by the filter are connected to the input of a radio frequency detector which provides an output indicative of the high frequency input. The high pass filter and detector are isolated from ground so that there is no path for arcing current to ground provided through the apparatus. The detector output is optically isolated from and coupled to a device for displaying the presence of voltage signals in the high pass band which are indicative of arcing current and subsequent pitting at the bearing-rotor shaft interfaces.

11 Claims, 3 Drawing Figures

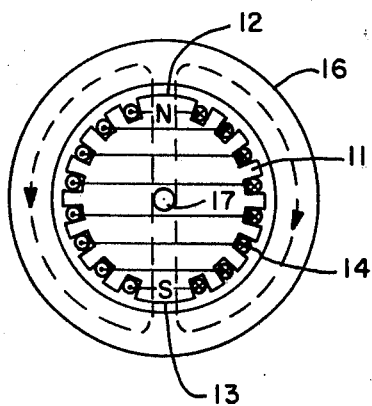
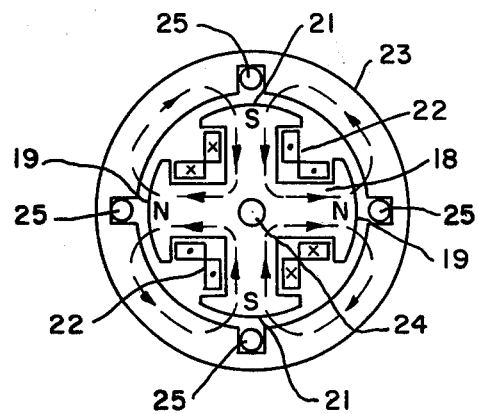
FIG.—1          FIG.—2
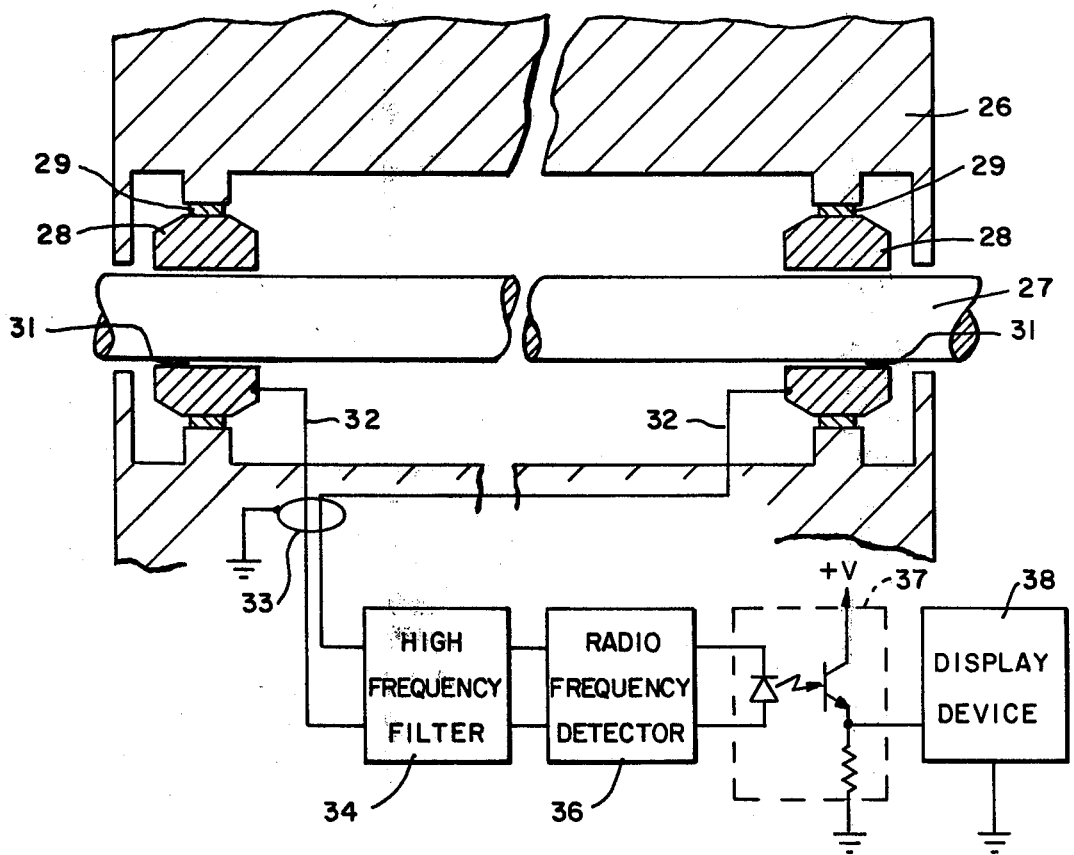
FIG.—3

TURBINE GENERATOR GROUND CURRENT ARCING DETECTION APPARATUS AND METHOD

BACKGROUND OF THE INVENTION

This invention relates to ground current arcing detection in large generator machinery, and more particularly to such arcing detection at the main bearings supporting the rotor shaft in the generator.

The rotor shaft in a large turbine generator and the two end bearings form a loop which acts as a secondary winding on a transformer. Voltage is induced in the rotor shaft due to flux density differences existing between the various flux paths within the machine. The flux density differences occur because the reluctance of the different flux paths within the machine is different. Consequently, a voltage is induced in the rotor shaft as it rotates through 180 electrical degrees. The end bearings are insulated from the machine frame. Without the end bearing insulation a current will flow from the rotor shaft to the machine frame due to the induced voltage in the shaft. Such currents do occur if the end bearing insulation breaks down. There is a film of lubricant between the bearings and the shaft in which ground current arcing takes place in such an instance. The current arcing operates to pit the bearing surfaces and cause eventual failure of the shaft and associated bearings. In the past it has been common to attempt to monitor the integrity of the bearing insulation by connecting a volt meter to the generator shaft by way of a brush and to measure the voltage drop across the oil film. In theory an increase in the level of this voltage indicates current arcing due to failure of the bearing insulation. However, arcing currents give rise to high frequency fluctuation in voltage signals which are not detected by most volt meters. As a consequence, ground current arcing can be occurring in the gap between rotor shaft and the bearing races, causing surface pitting, and remain undetected until bearing failure.

A method and apparatus for detecting ground current arcing in rotor bearings used on large generator machinery is needed to detect conditions indicating potential rotating machinery failures, and to pinpoint the specific areas within the machine at which the failure potential exists.

SUMMARY AND OBJECTS OF THE INVENTION

A generator has a frame in which the rotor shaft is supported for rotation within a pair of shaft bearings. The shaft bearings are insulated from the frame and a film of lubricant is disposed between the shaft and the bearings. An arc current detector includes means for receiving high frequency signals at an input, which provides an output in accordance therewith. The means for receiving high frequency signals is isolated from the ground reference for the generator. A conductor is connected between each of the shaft bearings and the input of the high frequency reception means. In this fashion an output is provided only when a failure in insulation between the shaft bearings and the frame occurs and a current flows from the shaft to the frame. The current is in a form of an arc current across the lubricant film at the interface between the shaft and the bearing races, causing pitting and degradation at the interface.

The method of detecting ground current arcing through a lubricant film between a generator shaft and a pair of shaft support bearings includes the steps of monitoring the voltage signal between the pair of support bearings and high pass filtering the voltage signal. Detecting radio frequencies in the high pass voltage signal provides an output signal which is indicative of current arcing at the bearing-shaft interface. The voltage signal is isolated from ground reference for the generator. Modulation of the detected frequencies is performed to obtain an output which is indicative of current arcing at the support bearings.

In general, it is an object of the present invention to provide a process by which positive identification of current arcing at the bearing-rotor shaft interface may be detected.

Another object of the present invention is to provide apparatus sensitive to phenomena induced by current arcing.

Another object of the present invention is to provide a method and apparatus for detecting the inception of phenomena known to eventually cause rotor bearing and shaft failures in large electrical generators.

Additional objects and features of the invention will appear from the following description in which the preferred embodiment has been set forth in detail in connection with the accompanying drawings.

BRIEF DESCRIPTION OF THE DRAWINGS

FIG. 1 is a simplified sectional view of a two-pole generator.

FIG. 2 is a simplified sectional view of a four-pole generator.

FIG. 3 is a partial sectional side elevational view of a large generator combined with a block diagram of the disclosed ground arc current detector.

DESCRIPTION OF THE PREFERRED EMBODIMENTS

FIG. 1 shows a section through a two-pole generator having a rotor 11 with a north pole 12 and a south pole 13 thereon. A field winding 14 is shown on the rotor, which provides magnetic flux indicated by the dotted lines shown by the arrows extending from south pole 13 toward north pole 12. A return flux path 16 is shown surrounding rotor 11 so that two flux paths are traversed by the magnetic flux emanating from north pole 12. It may be seen that as rotor 11 rotates the flux paths change. Since the reluctance of the flux path changes as rotor 11 turns, the flux density passing by a rotor shaft 17 varies cyclically as rotor 11 rotates through 180 mechanical or electrical degrees. A return flux path 23 provides a complete flux path from a north pole 19, through a gap between rotor 18 and return flux path 23, through flux path 23 and the air gap back to south pole 21. Four such flux paths are seen in FIG. 2. A rotor shaft 24 is shown which lies in all four of the flux paths. As a consequence any variation in flux density between the flux paths will show as a varying flux density cutting the shaft 24. Shaft 24 therefore operates as a single turn on a transformer secondary winding, and a voltage is induced between the ends thereof by the changing flux density. It may be seen that the primary changes in flux density will occur as rotor 18 rotates through 180 electrical degrees, which is 90 mechanical degrees in the four pole machine of FIG. 2. FIG. 2 also shows four armature paths 25.

Turning now to FIG. 3, a frame 26 is seen for a large turbine generator. A rotor shaft 27 is disposed within frame 26 and is supported at either end by a bearing 28. An insulator 29 surrounds each bearing 28, serving to mount bearing 28 within frame 26, and also to insulate bearings 28 from frame 26. Rotor shaft 27 has mounted thereon a rotor such as rotors 11 and 18 in FIGS. 1 and 2 respectively. There is a clearance between the inside diameter of each bearing 28 and the outside diameter of rotor shaft 27, within which is provided a thin lubricant film 31.

Failure of bearing insulation 29 will place the bearings 28 at the potential of frame 26 which will cause a high transient voltage to be developed between the rotor shaft 27 and bearings 28 at the interface therebetween. If this transient voltage is high enough, breakdown of the thin film of lubricant 31 will occur in the clearance space at the interface, which will create an arc discharge through the thin lubricant film 31. These arc current discharges cause high frequency voltage signals at the ends of the generator shaft 27 and between the end support bearings 28. Each arc current discharge that occurs at the interface of rotor shaft 27 and bearings 28 will produce a burst of radio frequency energy.

A conductor 32 is connected to each bearing 28 and is protected by a shield 33. Conductors 32 are connected to the input of a high frequency filter 34, which provides a high pass band output. The voltage signals in the high pass band are connected to the input of a radio frequency detector 36 which provides an output indicative of the high frequency voltage signal input. The output of the radio frequency detector 36 is demodulated and coupled through an optical isolator 37 to a display device such as a strip chart recorder, an oscilloscope, a VTVM, or a galvanometer. The transfer of the radio frequency energy from the rotor to the bearings 28 is by way of capacitive and resistive coupling. Both the high frequency filter 34 and the radio frequency detector 36 are isolated from ground potential for the frame 26 so there will be no path from the shaft 27 and/or bearings 28 to ground potential in the absence of failure of insulation 29. It may be seen that the high frequency filter 34 and radio frequency detector 36 operate to receive high frequency signals and provide an output in accordance with the received signals.

The method of detecting ground current arcing which occurs through lubricant film 31 between rotor shaft 27 and bearing 28 includes the steps of monitoring the voltage signal between the pair of support bearings 28, and high pass filtering the monitored voltage signal. The method includes detecting radio frequencies in the high pass filtered voltage signal which are generated by a current arc. The voltage signal is isolated from the generator ground reference in the filtering and detecting steps. The detected radio frequency voltage signals are modulated to obtain an output indicative of the current arcing. Transmission of the voltage signal from the pair of support bearings to the high pass filtering point is shielded to prevent spurious radiated signals from masking the signals generated by the current arcing. The modulated detected radio frequencies may thereafter be converted to a ground reference output which is used to activate a display device such as the strip chart recorder or oscilliscope mentioned hereinabove.

Apparatus and method for monitoring current arcing appearing due to insulation breakdown between a generator rotor shaft and a generator frame and consequent pitting of bearing surfaces at the interface between the rotor shaft and the bearings has been disclosed which does not use slip rings and/or brushes to obtain the monitoring signals. The apparatus and method is sensitive to the radio frequencies associated with current arcing, and is therefore specifically sensitive to the condition which causes the degradation of the mechanical parts for which the monitoring is employed. The apparatus and method can be used to provide continuous monitoring of the condition of the insulation between the rotor shaft and the frame, or it can be used on a periodic or sampling basis. If, for example, a strip chart recorder was used to continuously measure the level of radio frequency activity, any increase in the level of such activity from the previous background level would be an indication of current arcing at the interface between the rotor shaft and the bearings.

What is claimed is:

1. In a generator having a frame in which a rotor shaft is supported for rotation in a pair of shaft bearings, wherein the shaft bearings are insulated from the frame and a film of lubricant is disposed between the shaft and the bearings, an arc current detector comprising
a high pass filter having an input and an output and being electrically isolated from the frame, a shielded electrical connection between each of the shaft bearings and the input of said high pass filter,
a radio frequency detector coupled to receive the output of said high pass filter providing an output indicative thereof and being electrically isolated from the frame,
and means for receiving said detector output and providing a display thereof, said last named means being isolated electrically from said detector.

2. A generator as in claim 1 wherein said means for receiving and providing a display, comprises
a voltage sensing device, and an optical isolator connected between said radio frequency detector and said voltage sensing device.

3. Apparatus for detecting ground current arcing between a rotor shaft and a pair of support bearings therefor which are insulated from a frame for an electrical generator, comprising
means for receiving high frequency signals at an input thereto, and providing an output in accordance therewith, said last named means being isolated from ground reference for the generator, and a conductor connected therebetween each support bearing and the input of said means for receiving, whereby said output occurs only when a failure in insulation between the rotor shaft and the frame occurs and an arcing current flows thereacross.

4. Apparatus as in claim 3 together with an optical isolator receiving said output and providing a display input isolated from the rotor shaft,
and means for receiving said display input and providing a visual presentation indicative of arcing current and insulation failure.

5. Apparatus as in claim 3 wherein said means for receiving comprises
a high pass filter having an input configured to connect to said conductors, and providing an output signal in the high pass band,
and a high frequency detector receiving said high pass band output signal and thereby providing indication of said arcing current.

6. An electrical generator having a ground current arcing self monitor feature, comprising a frame a stator mounted in said frame a rotor shaft a rotor mounted on said rotor shaft a pair of shaft bearings supporting said rotor shaft for rotation within said frame bearing insulation between said pair of shaft bearings and said frame means isolated from ground reference for the generator having an input for receiving high frequency signals and providing an output in accordance therewith, and a conductor running from each of said pair of shaft bearings to the input of said means for receiving whereby high frequency signals which are generated by ground current arcing between said rotor shaft and shaft bearings when said bearing insulation breaks down are indicated by said output.

7. An electrical generator as in claim 6 wherein said means for receiving comprises a high pass filter and a radio frequency detector coupled to the output of said high pass filter and providing said output.

8. An electrical generator as in claim 6 together with an optical isolator receiving said output and providing a display input isolated from said rotor shaft, and means for receiving said display input and providing a visual indication of ground current arcing and insulation breakdown.

9. A method of detecting ground current arcing through a lubricant film between a generator shaft and a pair of shaft support bearings, comprising the steps of monitoring the voltage signal between the pair of support bearings, high pass filtering the voltage signal, detecting radio frequencies in the high passed voltage signal, said radio frequencies being indicative of current arcing, isolating the voltage signal from generator ground reference in the filtering and detecting steps, and modulating the detected radio frequencies to obtain an output indicative of current arcing.

10. A method as in claim 9 together with the step of shielding the voltage signal between the pair of support bearings, whereby spurious radiated signals are barred from the high pass filtering.

11. A method as in claim 9 together with the steps of converting the modulated output to a ground reference output and activating a display with the ground reference output, whereby a visual record of current arcing may be provided.

* * * * *